(12) United States Patent
Lee et al.

(10) Patent No.: US 12,716,914 B2
(45) Date of Patent: Aug. 25, 2026

(54) CONTACT PIN AND TEST SOCKET HAVING THE SAME

(71) Applicant: LST Co., Ltd, Asan-si (KR)

(72) Inventors: Gwanhyung Lee, Cheonan-si (KR); Seungdoo Kwon, Cheonan-si (KR)

(73) Assignee: LST CO., LTD, Asan-si (KR)

( * ) Notice: Subject to any disclaimer, the term of this patent is extended or adjusted under 35 U.S.C. 154(b) by 434 days.

(21) Appl. No.: 18/345,020

(22) Filed: Jun. 30, 2023

(65) Prior Publication Data

US 2024/0003938 A1 Jan. 4, 2024

(30) Foreign Application Priority Data

Jul. 1, 2022 (KR) ........................ 10-2022-0081399
Mar. 7, 2023 (KR) ........................ 10-2023-0029573
Apr. 18, 2023 (KR) ........................ 10-2023-0050523

(51) Int. Cl.

| | |
|---|---|
| ***G01R 1/067*** | (2006.01) |
| ***G01R 1/02*** | (2006.01) |
| ***G01R 1/04*** | (2006.01) |
| ***G01R 1/073*** | (2006.01) |
| ***G01R 31/26*** | (2020.01) |
| ***G01R 31/28*** | (2006.01) |

(52) U.S. Cl.
CPC ....... *G01R 1/06722* (2013.01); *G01R 1/0466* (2013.01); *G01R 31/2601* (2013.01)

(58) Field of Classification Search
CPC . G01R 1/02; G01R 1/04; G01R 1/067; G01R 1/073; G01R 31/26; G01R 31/28
See application file for complete search history.

(56) References Cited

U.S. PATENT DOCUMENTS 7,025,602 B1 * 4/2006 Hwang ................ H01R 12/714 439/66
11,187,722 B2 * 11/2021 Teranishi ............... H01R 13/24
2021/0102973 A1 * 4/2021 Hwang .............. G01R 31/2886

FOREIGN PATENT DOCUMENTS

| | | | |
|---|---|---|---|
| KR | 10-1116225 B1 | 3/2012 | |
| KR | 101348206 B1 | 1/2014 | |
| KR | 20180038031 A | 4/2018 | |
| KR | 10-2171289 B1 | 10/2020 | |
| WO | WO2015126064 * | 8/2015 | ......... G01R 1/06722 |

* cited by examiner

*Primary Examiner* — Neel D Shah
(74) *Attorney, Agent, or Firm* — Rabin & Berdo, P.C.

(57) ABSTRACT

The present invention relates to a contact pin, and more particularly, to a contact pin installed in a test socket performing a test on a semiconductor device and a test socket having the same. The present invention discloses a contact pin including: a first member (100) including a first terminal (120) disposed at one end thereof to contact one of a test terminal and a terminal of a semiconductor product; a second member (300) including a second terminal disposed at one end thereof to contact the other of the test terminal and the terminal of the semiconductor product; and a coil spring (200) into which at least a portion of a movably overlapped portion of the first member (100) and the second member (300) is inserted.

21 Claims, 21 Drawing Sheets

CONTACT PIN AND TEST SOCKET HAVING THE SAME

BACKGROUND

The present invention relates to a contact pin, and more particularly, to a contact pin installed in a test socket performing a test on a semiconductor device and a test socket having the same.

Semiconductor products such as CPUs, mobile CPUs, SDRAMs, ROMs, and camera modules undergo an electrical test to increase product reliability before released to the market, and only products that pass the test are selected and released.

Also, the electrical test for the semiconductor products is performed by applying electricity after the semiconductor products are seated in the test socket installed on the test board.

Here, a conventional test socket includes contact pins corresponding to terminals of the semiconductor product, and the electrical test is performed on the semiconductor product by electrically connecting the terminals of the semiconductor product and terminals on the test board when the semiconductor product is seated thereon.

The above-described contact pins of the test socket are required to stably transmit an electrical signal between the semiconductor product and the test board, and be easily assembled and minimize deformation despite of frequent usage.

(Paten Document 1) KR 10-2171289 B1

(Paten Document 2) KR 10-1116225 B1

SUMMARY

The present invention provides a contact pin that is easily assembled, stably transmits an electrical signal, and minimizes deformation despite of long-time usage to improve a lifespan and a test socket having the same.

In accordance with an embodiment of the present invention, a contact pin includes: a first member 100 having a first terminal 120 disposed at one end thereof to contact one of a test terminal and a terminal of a semiconductor product; a second member 300 having a second terminal 320 contacting the other of the test terminal and the terminal of the semiconductor product; and a coil spring 200 into which at least a portion of a movably overlapped portion of the first member 100 and the second member 300 is inserted.

The first member 100 may include a first plate-shaped member 110 having a bent hook portion 111 formed at the other end thereof and a first pressing portion 112 spaced apart from the hook portion 111 to press one end of the coil spring 200, and the second member 300 may include a second plate-shaped member 310 in which a hook stepped portion 311 disposed in parallel with the first plate-shaped member 110 is formed at one end so that the hook portion 111 is hooked in a direction in which the coil spring 200 is spread and moves in a direction in which the coil spring 200 is contracted, and a second pressing portion 312 configured to press the other end of the coil spring 200 is formed at the other end.

The second plate-shaped member 310 may include: a first parallel portion 314 parallel to the first plate-shaped member 110; a bent portion 315 integrally bent with the first parallel portion 314 so as to be engaged with a portion in which the hook portion 111 of the first plate-shaped member 110 is formed; and a second parallel portion 313 integrated with the bent portion 315 so as to be parallel with the first parallel portion 314 and connected to the second terminal 320.

The first pressing portion 112 may extend laterally from the first plate-shaped member 110, and the second pressing portion 312 may extend laterally from the second plate-shaped member 310.

The first pressing portion 112 may be bent perpendicularly to a plate surface of the first plate-shaped member 110 to guide a linear movement of the second plate-shaped member 310.

The second pressing portion 312 may be bent perpendicularly to a plate surface of the second plate-shaped member 310 to guide a linear movement of the first plate-shaped member 110.

The first terminal 120 may be integrated with the first plate-shaped member 110 and made of a metal plate.

The first terminal 120 may be formed such that the metal plate is bent into a cylindrical shape.

The second terminal 320 may be integrated with the second plate-shaped member 310 and made of a metal plate.

The second terminal 320 may be formed such that the metal plate is bent into a cylindrical shape.

In accordance with another embodiment of the present invention, a contact pin includes a first member 100 having a first terminal 120 disposed at one end thereof to contact one of a test terminal and a terminal of a semiconductor product; a second member 300 having a second terminal 320 contacting the other of the test terminal and the terminal of the semiconductor product; and a coil spring 200 into which at least a portion of a movably overlapped portion of the first member 100 and the second member 300 is inserted. The first member 100 includes: a first plate-shaped member 510 having one end connected with the first terminal 120 and the other end on which a bent hook portion 500 is formed; and a first pressing portion 530 formed on the first terminal 120 to press one end of the coil spring 200, and the second member 300 includes: a second plate-shaped member 410 having one end connected with the second terminal 320 and overlapping the first plate-shaped member 510; and a protruding portion 400 formed at one side of the second plate-shaped member 410 to surround the first plate-shaped member 510, thereby pressing the other end of the coil spring 200. Here, the protruding portion 400 is hooked by the hook portion 500 in a direction in which the coil spring 200 is spread by a relative movement of the first plate-shaped member 510 and the second plate-shaped member 410.

The first pressing portion 530 may extends laterally from the first terminal 120.

The protruding portion 400 may include: a parallel portion 401 in parallel to the second plate-shaped member 410 with the first plate-shaped member 510 therebetween; a connection portion 402 configured to connect the second plate-shaped member 410 and the parallel portion 401; and a bent portion 403 bent from the parallel portion 401 in a direction away from the first plate-shaped member 510.

The first terminal 120 may be integrated with the first plate-shaped member 510 and made of a metal plate, and the second terminal 320 may be integrated with the second plate-shaped member 410 and made of a metal plate.

A first bent portion 540 may be disposed between the first terminal 120 and the first plate-shaped member 510, and a second bent portion 440 may be disposed between the second terminal 320 and the second plate-shaped member 410.

The first terminal 120 may have a plate shape extending from the first bent portion 540, and the second terminal 320 may have a plate shape extending from the second bent portion 440.

A central axis C1 of the first terminal 120 and a central axis C2 of the second terminal 120 may be coincided with or eccentric to each other.

In accordance with another embodiment of the present invention, a test socket includes: a socket body to which a semiconductor product to be tested is mounted; and a plurality of contact pins installed on the socket body to electrically connect a terminal of the semiconductor product and a terminal on a test board, and at least one of the contact pins is the contact pin among the above-described contact pins.

In accordance with another embodiment of the present invention, a contact pin includes a first member 100 having a first terminal 120 disposed at one end thereof to contact one of a test terminal and a terminal of a semiconductor product; a second member 300 having a second terminal 320 contacting the other of the test terminal and the terminal of the semiconductor product; and a coil spring 200 into which at least a portion of a movably overlapped portion of the first member 100 and the second member 300 is inserted. The coil spring 200 includes: a first coil spring portion 210 installed adjacent to the first terminal 120; and a second coil spring portion 220 installed adjacent to the second terminal 320 and connected with the first coil spring portion 210, and a spring diameter D1 of the first coil spring portion is different from a spring diameter D2 of the second coil spring portion 220.

The spring diameter D1 of the first coil spring portion 210 may be less than the spring diameter D2 of the second coil spring portion 220.

A length difference between the spring diameter D1 of the first coil spring portion 210 and a diagonal length L of a horizontal cross-section of the movably overlapped portion of the first member 100 and the second member 300 may be 0.05 mm or less.

The first member 100 may include a first plate-shaped member 110 having a bent hook portion 111 formed at the other end and a first pressing portion 112 spaced apart from the hook portion 111 to press one end of the coil spring 200, and the second member 300 may include a second plate-shaped member 310 in which a hook stepped portion 311 disposed in parallel with the first plate-shaped member 110 is formed at one end so that the hook portion 111 is hooked in a direction in which the coil spring 200 is spread and moves in a direction in which the coil spring 200 is contracted, and a second pressing portion 312 configured to press the other end of the coil spring 200 is formed at the other end.

The first terminal 120 may be integrated with the first plate-shaped member 110 and made of a metal plate, and the second terminal 320 may be integrated with the second plate-shaped member 310 and made of a metal plate.

At least one of the first terminal 120 and the second terminal 320 may be formed such that the metal plate is bent into a cylindrical shape.

At least one of the first terminal 120 and the second terminal 320 may be formed such that the metal plate is bent into a U-shape.

BRIEF DESCRIPTION OF THE FIGURES

FIG. 1A is a perspective view illustrating a state in which a coil spring is spread, and FIG. 1B is a perspective view illustrating a state in which a coil spring is contracted.

FIG. 2A is a cross-sectional view illustrating the state in which the coil spring is spread, and FIG. 2B is a cross-sectional view illustrating the state in which the coil spring is contracted.

FIG. 4A is a perspective view illustrating the state in which the coil spring is spread, and FIG. 4B is a perspective view illustrating the state in which the coil spring is contracted.

FIG. 5A is a cross-sectional view illustrating the state in which the coil spring is spread, and FIG. 5B is a cross-sectional view illustrating the state in which the coil spring is contracted.

FIG. 11A is a perspective view illustrating the state in which the coil spring is spread and FIG. 11B is a perspective view illustrating the state in which the coil spring is contracted.

DETAILED DESCRIPTION

Figure 1A:
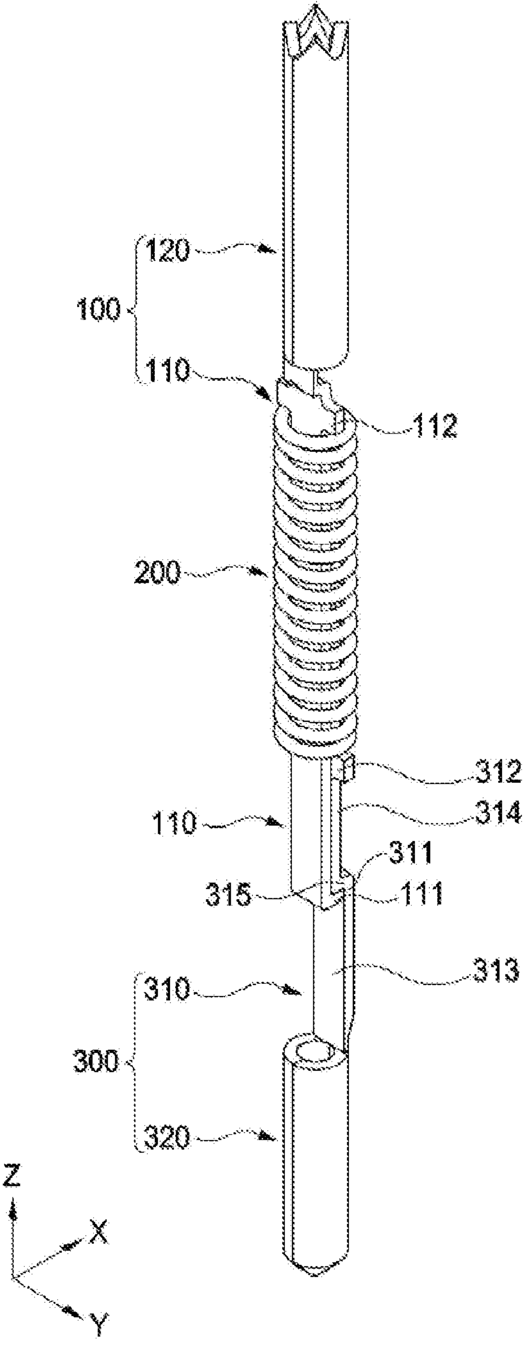
FIGS. 1A and 1B are perspective views illustrating a contact pin in accordance with a first embodiment of the present invention.
Figure 1B:
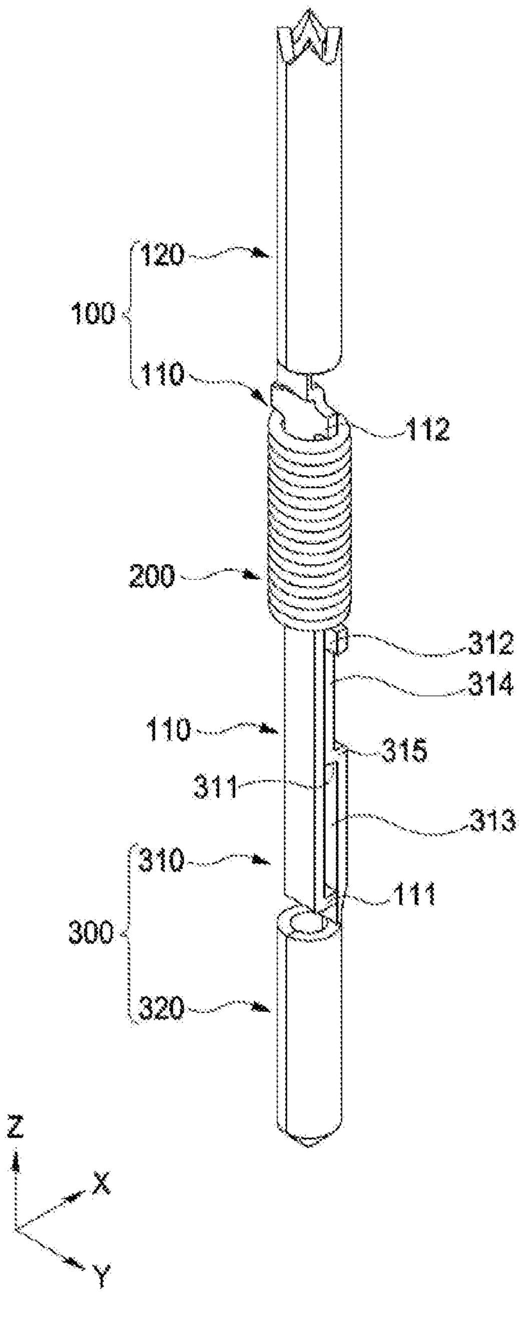
Figure 2A:
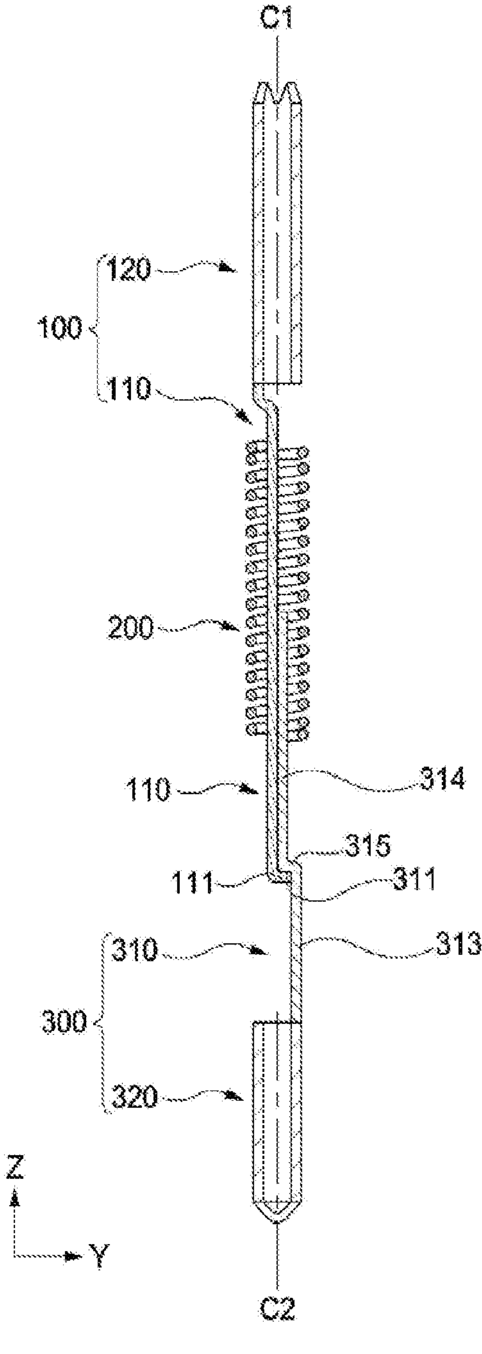
FIGS. 2A and 2B are cross-sectional views of FIGS. 1A and 1B, respectively.
Figure 2B:
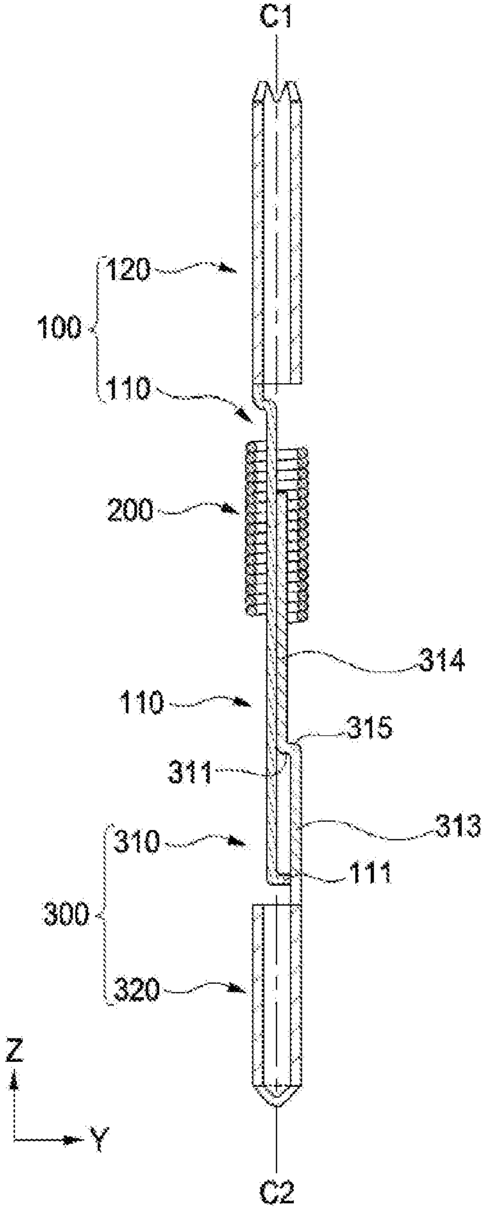
Figure 3:
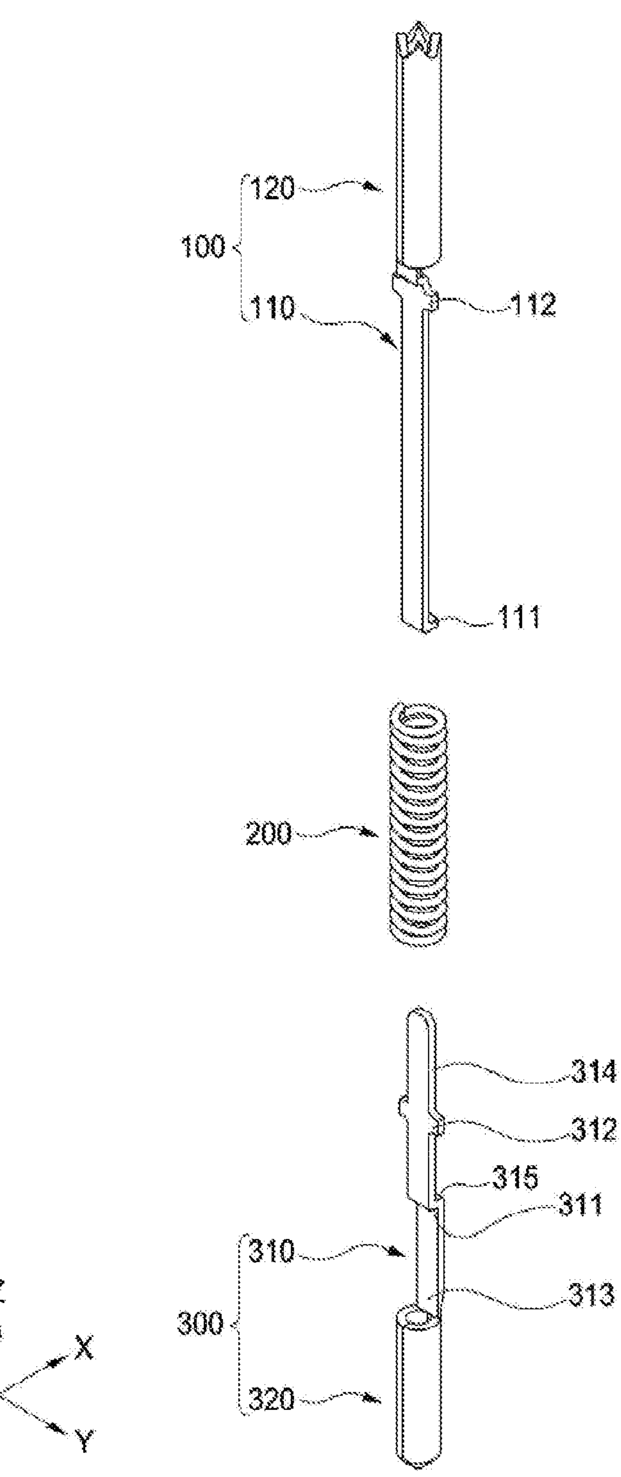
FIG. 3 is an exploded perspective view illustrating the contact pin of FIG. 1A.
Figure 4A:
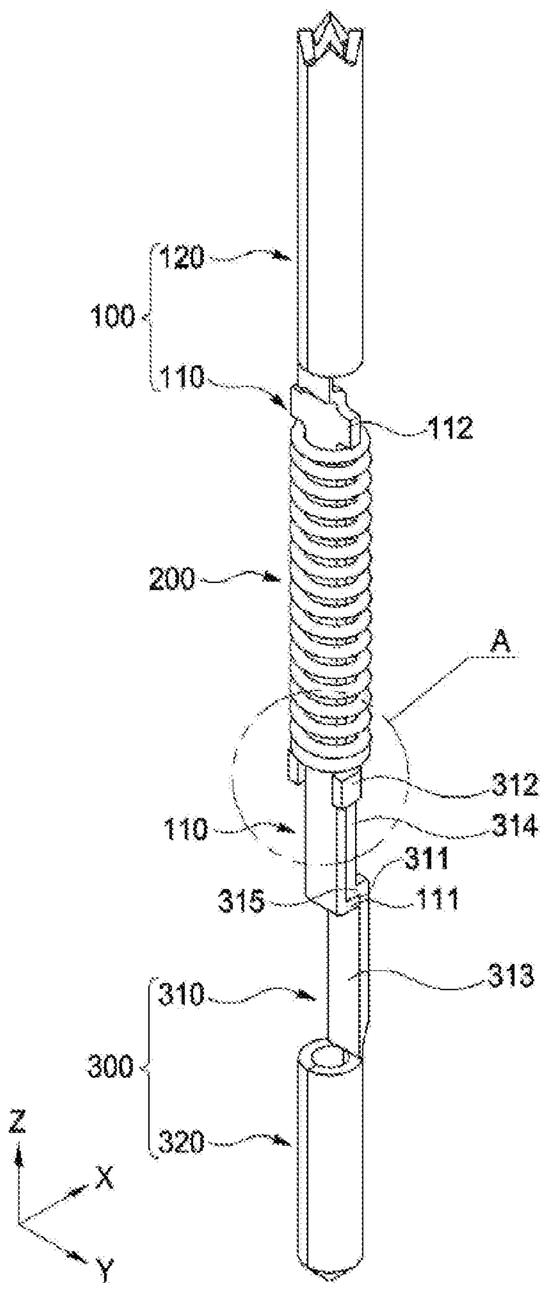
FIGS. 4A and 4B are perspective views illustrating a contact pin in accordance with a second embodiment of the present invention.
Figure 4B:
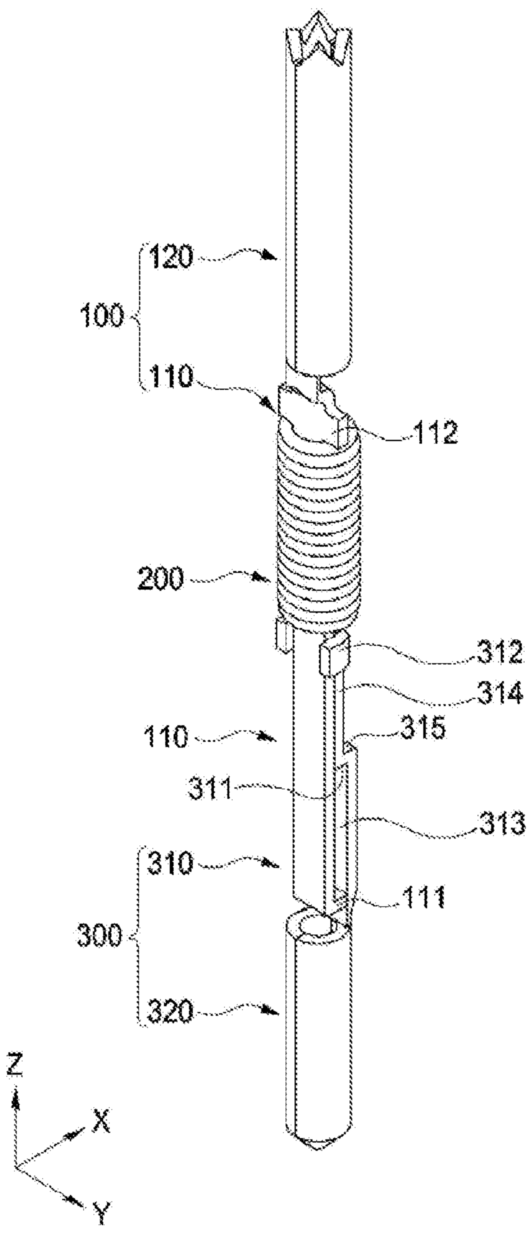
Figure 5A:
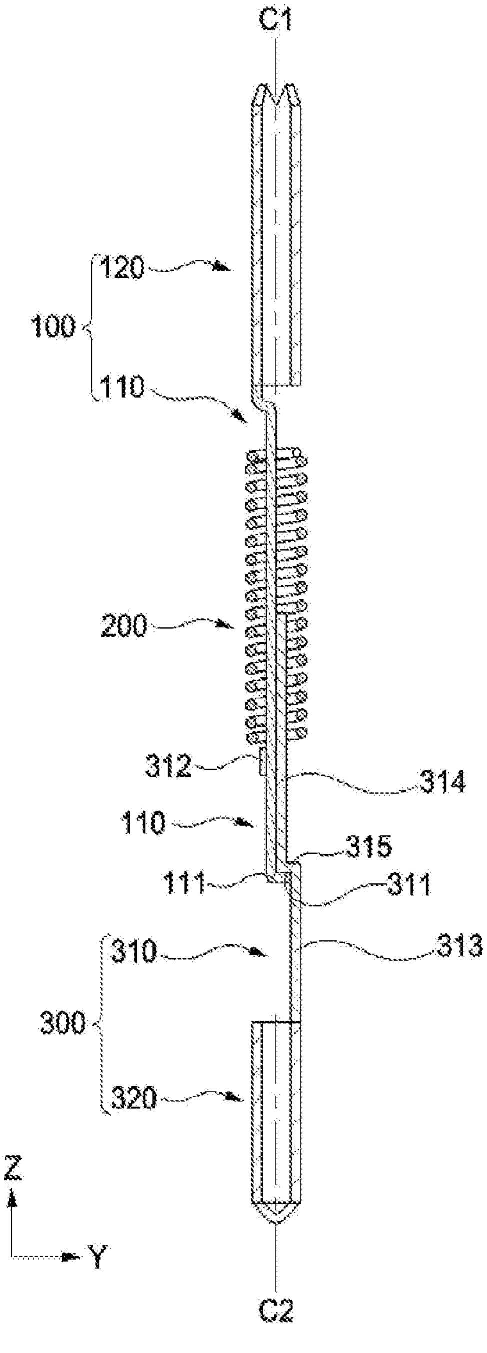
FIGS. 5A and 5B are cross-sectional views of FIGS. 4A and 4B, respectively.
Figure 5B:
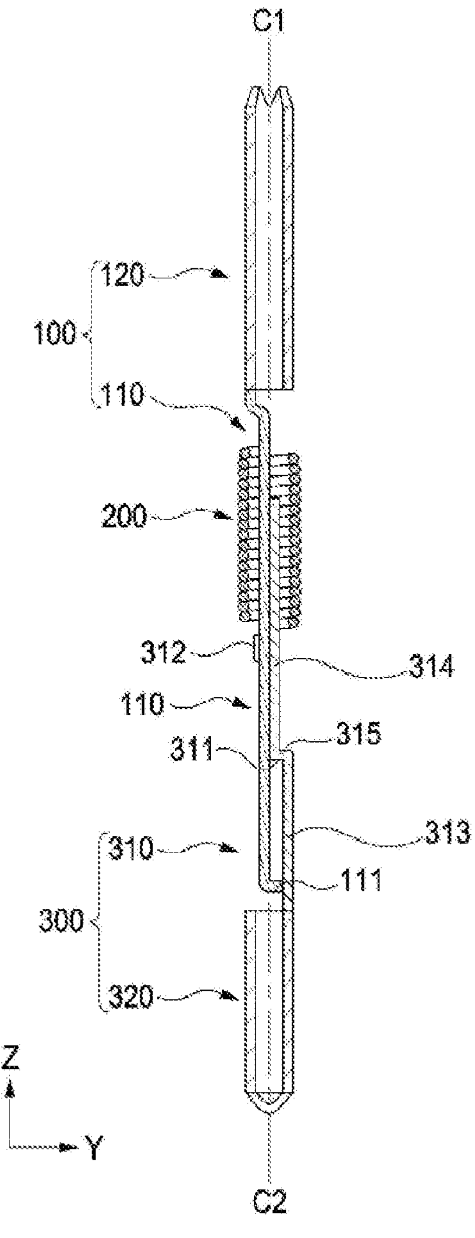
Figure 6:
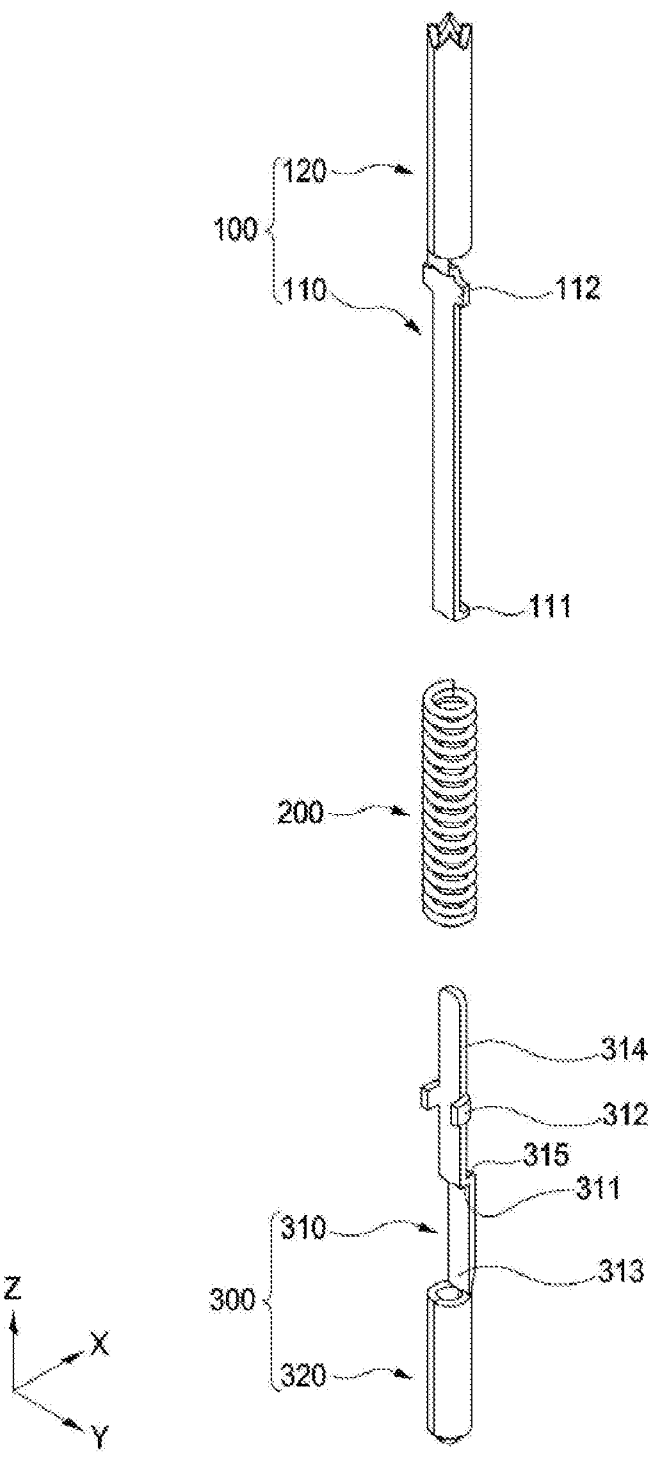
FIG. 6 is an exploded perspective view illustrating the contact pin of FIG. 4A.

Hereinafter, a contact pin and a test socket including the same in accordance with the present invention will be described with reference to the accompanying drawings.

As illustrated in FIGS. 1A to 8, the contact pin in accordance with the present invention includes: a first member 100 including a first terminal 120 disposed at one end thereof to contact one of a test terminal and a terminal of a semiconductor product; a second member 300 including a second terminal disposed at one end thereof to contact the other of the test terminal and the terminal of the semiconductor product; and a coil spring 200 into which at least a portion of a movably overlapped portion of the member 100 and the second member 300 is inserted.

The first member 100 that includes the first terminal 120 disposed at one end thereof to contact one of the test terminal and the terminal of the semiconductor product may have various configurations.

The first member 100 may be molded into an integrated structure including the first terminal by using a jig after being cut from a metal plate to have a shape illustrated in FIGS. 1A to 3 and 4A to 6.

Also, the first member 100 may be made of a material with high conductivity such as copper or copper alloy (BeCu, etc.), and more preferably, be plated with gold to increase electrical conductivity.

The first terminal 120 that is one of the test terminal and the terminal of the semiconductor product and contacts the terminal of the semiconductor product in an embodiment of the present invention may have various structures as long as, e.g., the first terminal 120 stably contacts a ball terminal formed on a bottom surface of a semiconductor chip.

For example, the first terminal 120 may have a cylindrical structure formed such that a metal plate is bent into a cylindrical shape.

More specifically, as illustrated in FIGS. 1A to 6, the first terminal 120 may form the cylindrical shape such that both sides are bent to form a semicircle of the cylinder shape.

Also, the first terminal 120 may be integrated with a first plate-shaped member 110 by using a metal plate.

The first member 100 may include a first plate-shaped member 110 having a bent hook portion 111 at the other end and a first pressing portion 112 spaced apart from the hook portion 111 to press one end of the coil spring 200.

The first plate-shaped member 110 that is a plate-shaped member having the hook portion 111 and the first pressing portion 112 may have a rectangular shape having a planar shape extending in a longitudinal direction thereof.

The first plate-shaped member 110 has one end to which the first terminal 120 is connected and the other end on which the hook portion 111 that will be described later is formed.

Here, the first terminal 120 may be integrated with the first plate-shaped member 110. Alternatively, the first terminal 120 and the first plate-shaped member 110 may be coupled by using a separate member through welding or the like.

The hook portion 111 that is bent at the other end of the first plate-shaped member 110 and hooked by a hook stepped portion 311 that will be described later may have various structures according to a hook structure with the hook stepped portion 311.

Also, the hook portion 111 may have a structure capable of maintaining a state of being hooked to the hook stepped portion 311 despite of elastic force of the coil spring 200 that will be described later.

For example, the hook portion 111 may be bent at an angle of 45° or more, preferably 80° or more, with respect to a plate surface of the first plate-shaped member 110.

Here, the hook stepped portion 311 that will be described later may have a structure that is engaged with the bent structure of the hook portion 111 or be bent to be hooked by the hook portion 111.

The first pressing portion 112 that presses an end of the coil spring 200 together with a second pressing portion 312 that will be described later may have any structure as long as the structure protrudes laterally from an edge of the first plate-shaped member 110 so as to press the coil spring 200.

Figure 7:
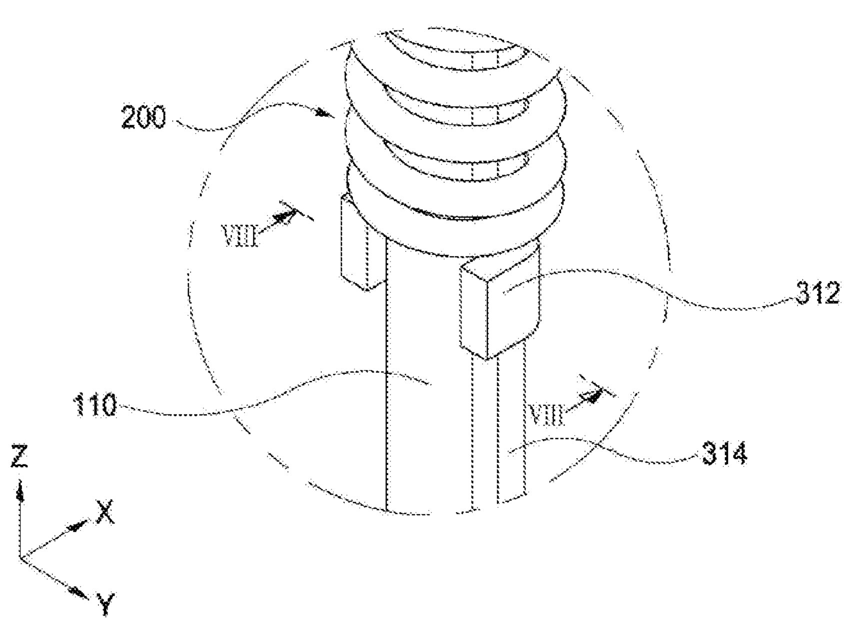
FIG. 7 is a partially enlarged view illustrating portion A of FIG. 4A.
Figure 8:
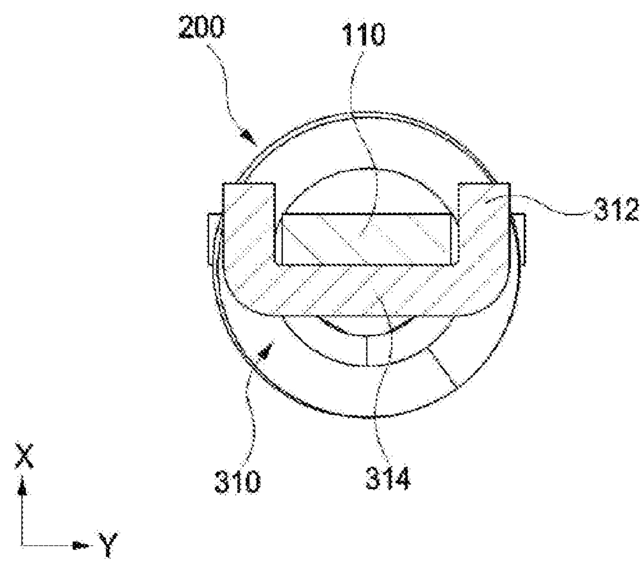
FIG. 8 is a cross-sectional view taken along line VIII-VIII in FIG. 7.

Also, as illustrated in FIGS. 7 and 8, the first pressing portion 112 may protrude laterally and then be bent again to guide a linear movement of the second plate-shaped member 310 with an edge of the second plate-shaped member 310 of the second member 300 that will be described later therebetween.

That is, the first pressing portion 112 may extend laterally from the first plate-shaped member 110 and be bent to be perpendicular to a plate surface of the first plate-shaped member 110 to guide the linear movement of the second plate-shaped member 310.

The second member 300 that includes the second terminal 310 contacting the other of the test terminal and the terminal of the semiconductor product and disposed at one end thereof may have various configurations.

The second member 300 may be molded into an integrated structure including the second terminal 320 by using a jig after being cut from a metal plate to have a shape illustrated in FIGS. 1A to 3 and 4A to 6.

Also, the second member 300 may be made of a material with high conductivity such as copper or copper alloy (BeCu, etc.), and more preferably, be plated with gold to increase electrical conductivity.

The second terminal 320 that is one of the test terminal and the terminal of the semiconductor product and contacts the test terminal in an embodiment of the present invention may have various structures as long as, e.g., the second terminal 320 stably contacts the test terminal installed to a test board.

For example, the second terminal 320 may have a cylindrical structure formed such that a metal plate is bent into a cylindrical shape.

More specifically, as illustrated in FIGS. 1A to 6, the second terminal 320 may form the cylindrical shape such that both sides are bent to form a semicircle of the cylinder shape.

Also, the second terminal 320 may be integrated with a second plate-shaped member 310 by using a metal plate.

On the other hand, the second terminal 320 may have a central axis (axis in the Z-direction) that is coincided with or eccentric from that of the first terminal 310 depending on an installation structure of the test pin.

That is, as illustrated in FIGS. 2A, 2B, 5A, and 5B, the central axis (axis in the Z-direction) of the second terminal 320 may be coincided with that of the first terminal 310.

Figure 9A:
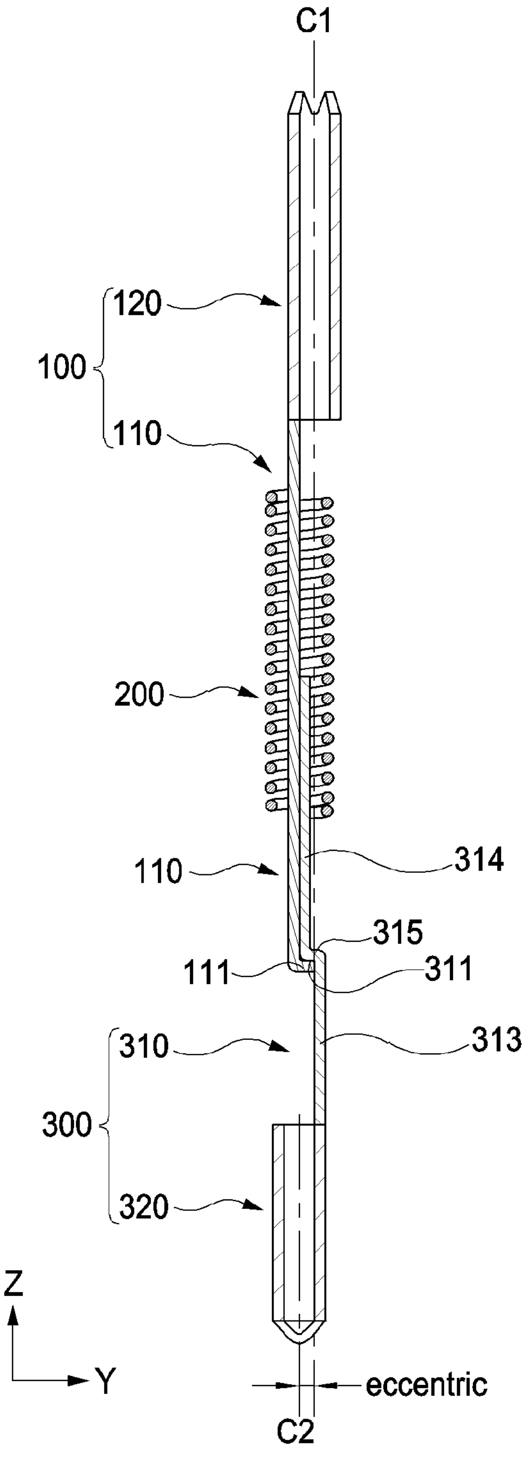
FIGS. 9A and 9B are cross-sectional views illustrating modified examples of structures of FIGS. 2A and 2B, respectively, and showing a state in which central axes of a first terminal and a second terminal are eccentric to each other.
Figure 9B:
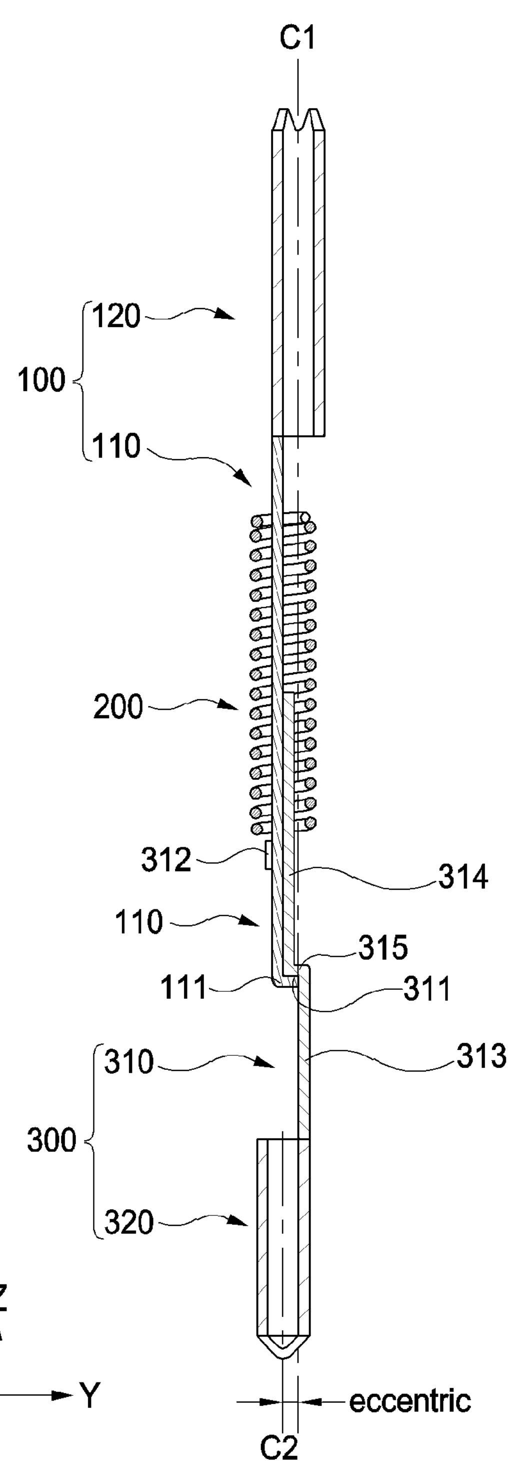

Also, as illustrated in FIGS. 9A and 9B, the central axis (axis in the Z-direction) of the second terminal 320 may be eccentric from that of the first terminal 310.

On the other hand, the second terminal 320 may be formed on a surface opposite to a surface facing the first plate-shaped member 120 in the second plate-shaped member 310, and the first terminal 310 may be formed on a surface opposite to a surface facing the second plate-shaped member 320 in the first plate-shaped member 310 for coincidence or eccentricity of central axes C1 and C2.

Also, a connection portion between the second terminal 320 and the second plate-shaped member 310 and a connection portion between the first terminal 120 and the first plate-shaped member 110 may be appropriately deformed according to the coincidence or eccentricity of the central axis C1 of the first terminal 120 and the central axis C2 of the second terminal 320.

The second member 300 may include a second plate-shaped member 310 in which the hook stepped portion 311 disposed parallel to the first plate-shaped member 110 is formed at one end so that the hook portion 111 is hooked in a direction in which the coil spring 200 is spread and the hook portion 111 moves in a direction in which the coil spring 200 is contracted, and a second pressing portion 312 pressing the other end of the coil spring 200 is formed at the other end.

The second plate-shaped member 310 that is a plate-shaped member having the hook stepped portion 311 and the second pressing portion 312 may have a rectangular shape in which a planar shape extends in a longitudinal direction thereof.

Particularly, the second plate-shaped member 310 may include a first parallel portion 314 parallel to the first plate-shaped member 110, a bent portion 315 integrally bent with the first parallel portion 314 so that the hook portion 111 of the first plate-shaped member 110 is hooked, and a second parallel portion 313 integrated with the bent portion 315 so as to be parallel to the first parallel portion 314 and connected to the second terminal 320.

The first parallel portion 314 that is a plate-shaped member laminated in parallel with the first plate-shaped member 110 in a vertical direction may have a rectangular shape in which a planar shape extends in a longitudinal direction thereof.

Here, the first parallel portion 314 may have a width equal to that of the first plate-shaped member 110. However, the first parallel portion 314 is unnecessary to have the same width as the first plate-shaped member 110. The first parallel portion 314 may have a width enough to stably guide a linear movement of the first plate-shaped member 110 in a state of being inserted into the coil spring 200 that will be described later.

Also, the first parallel portion 314 may have a length enough to stably guide the linear movement of the first plate-shaped member 110.

On the other hand, the second pressing portion 312 that will be described later may be formed at a side of the first parallel portion 314.

The bent portion 315 that is a portion bent integrally with the first parallel portion 314 so that the hook portion 111 of the first plate-shaped member 110 is hooked may have a structure bent enough to hook the hook portion 111.

Particularly, the bent portion 315 may be bent to be engaged with a portion in which the hook portion 111 is formed to form a stable hook structure with the hook portion 111.

That is, the bent portion 315 may be bent at the same angle as a bent angle of the hook portion 111.

The second parallel portion 313 that is integrated with the bent portion 315 to be parallel with the first parallel portion 314 and connected to the second terminal 320 may have various structures.

The second parallel portion 313 that is a plate-shaped member extending in parallel with the first parallel portion 314 may have a rectangular shape in which a planar shape extends in a longitudinal direction thereof.

Here, although the second parallel portion 313 may have the same width as the first parallel portion 314, the second parallel portion 314 is unnecessary to have the same width as the first parallel portion 314.

On the other hand, the second terminal 320 is connected to the other end of the second plate-shaped member 310.

Here, the second terminal 320 may be integrated with the second plate-shaped member 310. Alternatively, the second terminal 320 and the second plate-shaped member 310 may be coupled by using a separate member through welding.

The hook portion 311 that is formed on the second plate-shaped member 310 to hook the hook portion 111 of the first plate-shaped member 110 may have various structures according to a hook structure with the hook portion 111.

Also, the hook stepped portion 311 may have all types of structures capable of maintaining a hooked state of the hook portion 211 despite of elastic force of the coil spring 200 that will be described later.

For example, the hook stepped portion 311 may be bent at an angle of 45° or more, preferably 80° or more, with respect to a plate surface of the first parallel portion 314 of the second plate-shaped member 310.

Here, the hook stepped portion 311 may have a structure that is engaged with the bent structure of the hook portion 111 or be bent to be hooked by the hook portion 111.

The second pressing portion 312 that presses an end of the coil spring 200 together with the first pressing portion 112 may have any structure as long as the structure protrudes laterally from an edge of the second plate-shaped member 310 so as to press the coil spring 200.

Also, as illustrated in FIGS. 7 and 8, the second pressing portion 312 may protrude laterally and then be bent again to guide a linear movement of the first plate-shaped member 110 with an edge of the first plate-shaped member 110 of the first member 100 therebetween.

That is, the second pressing portion 312 may extend laterally from the second plate-shaped member 310 and be bent to be perpendicular to a plate surface of the second plate-shaped member 310 to guide the linear movement of the first plate-shaped member 110.

The coil spring 200 that is a component into which at least a portion of the movably overlapped portion of the first member 100 and the second member 300 is inserted may have various configurations.

The coil spring 200 may have any structure as long as the structure has one end supported by the first pressing portion 112 and the other end supported by the second pressing portion 312, and at least a portion of the overlapped portion of the first member 100 and the second member 300 is inserted to the structure.

Here, an outer shape of the coil spring may have a diameter and elasticity that are determined under a condition in which a stable elastic action is performed at an inner circumference in a state in which the first member 100 and the second member 300 overlap each other.

Also, the coil spring 200 may be made of a metal material such as SUS, a music wire, or BeCu in consideration of maintaining elasticity, and may be plated with nickel or gold.

The coil spring 200 may have various cross-sectional shapes such as a circular shape, a rectangular shape, and an elliptical shape in correspondence to the overlapped shape of the first member 100 and the second member 300.

Since the first member 100 and the second member 300 are required to maintain elastic force, a heat treatment may be performed thereon.

Also, a contact surface of the first plate-shaped member 110 and the second plate-shaped member 310 forms a plane, and a surface opposite thereto has a cross-sectional shape of a trapezoidal, semi-elliptical, or a semi-circular shape.

The contact pin having the above-described configuration in accordance with the present invention may have a simple structure to be easily manufactured and save manufacturing costs as at least a portion of the overlapped portion of the first member 100 and the second member 300 is inserted and assembled to the coil spring 200.

Figure 10:
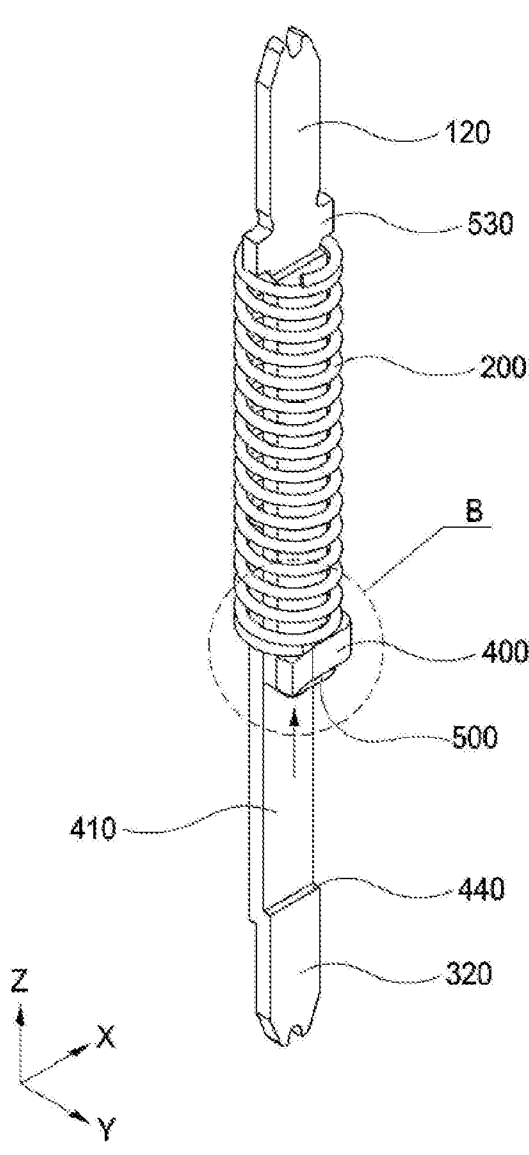
FIG. 10 is a perspective view illustrating a contact pin in accordance with a modified example of the present invention.
Figure 11A:
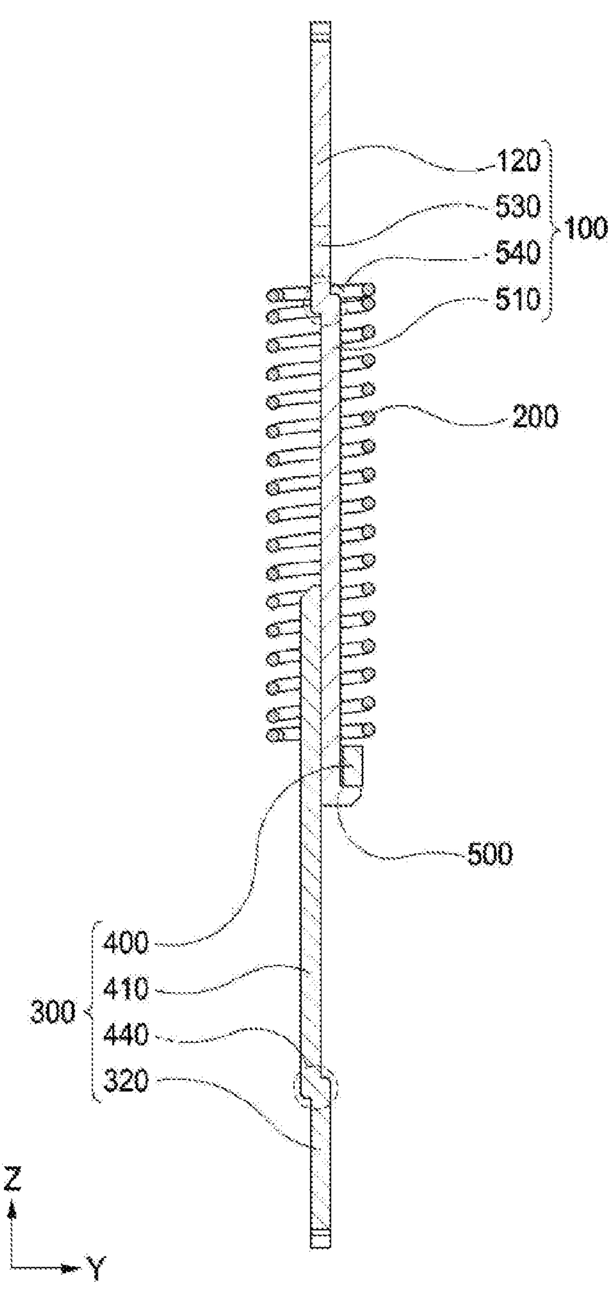
FIGS. 11A and 11B are perspective views illustrating a contact pin in accordance with a modified example of the present invention.
Figure 11B:
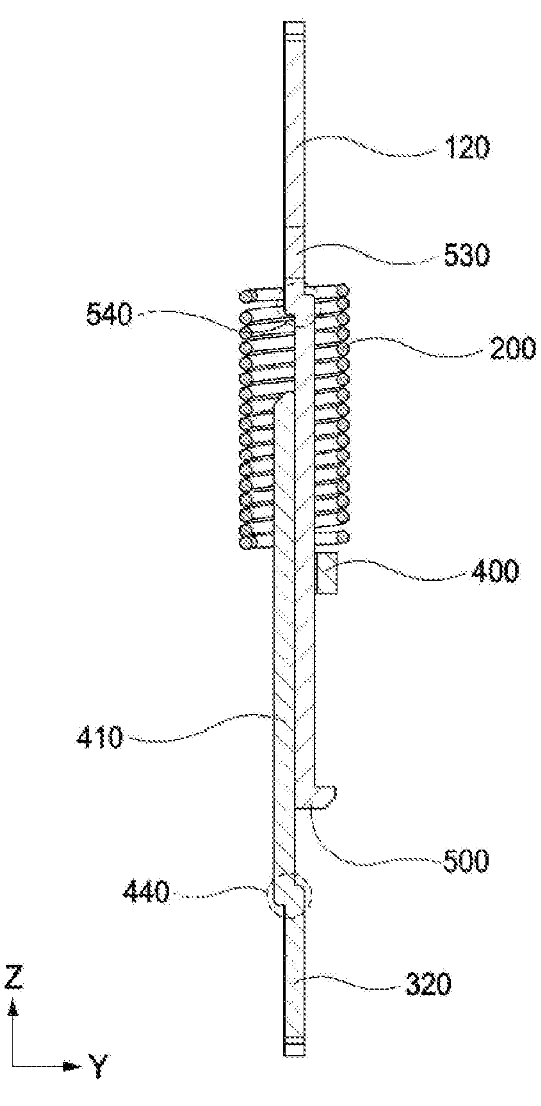
Figure 12:
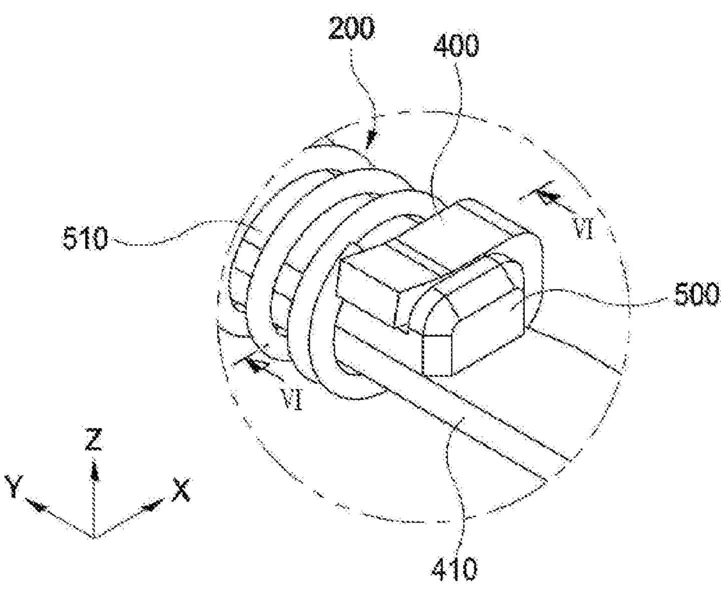
FIG. 12 is a partially enlarged view illustrating portion B of FIG. 10.
Figure 13:
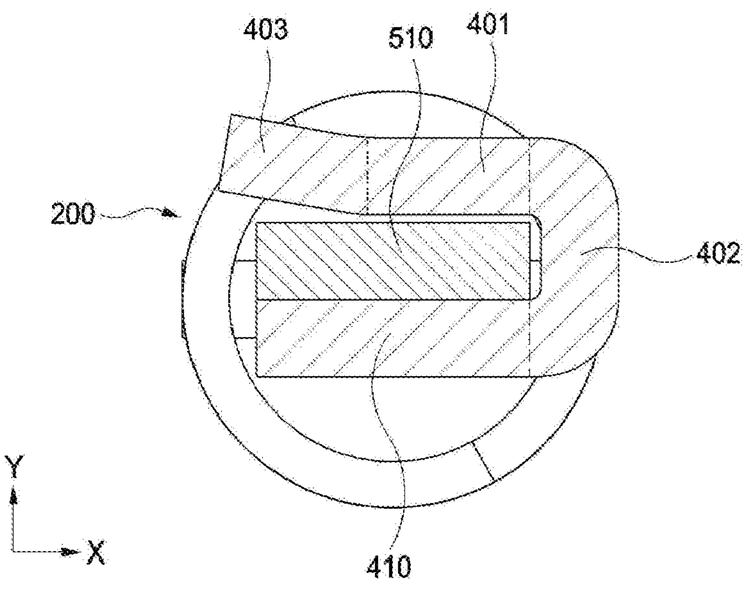
FIG. 13 is a cross-sectional view taken along line VI-VI in FIG. 12.

A contact pin in accordance with another aspect of the present invention includes: a first member 100 having a first terminal 120 disposed at one end thereof and contacting one of a test terminal and a terminal of a semiconductor product; a second member 300 having a second terminal 320 disposed at one end thereof and contacting the other of the test terminal and the terminal of the semiconductor product; and a coil spring 200 into which at least a portion of the movably overlapped portion of the first member 100 and the second member 300 is inserted. Here, the first member 100 includes: a first plate-shaped member 510 having one end connected with the first terminal 120 and the other end on which a hook portion 500 is bent and formed; and a first pressing portion 530 formed on the first terminal 120 to press one end of the coil spring 200. The second member 300 includes: a second plate-shaped member 410 having one end connected with the second terminal 320 and overlapping the first plate-shaped member 510; and a protruding portion 400 disposed at one side of the second plate-shaped member 410 to surround the first plate-shaped member 510 and pressing the other end of the coil spring 200. The protruding portion 400 may be hooked by the hook portion 500 in a direction in which the coil spring 200 is spread by a relative movement of the first plate-shaped member 510 and the second plate-shaped member 410. The contact pin having the above-described structure in accordance with the present invention may be checked in FIGS. 10 and 11.

The contact pin having the above-described structure in accordance with the present invention may spread or contract the coil spring 200 by a relative movement of the first member 100 and the second member 300.

When the coil spring 200 is maximally contracted, the hook portion 500 formed on the first member 100 comes into contact with a second bent portion 440 formed on the second member 300. In this case, the second bent portion 440 may serve as a stopper to prevent the hook portion 500 from moving in a direction in which the coil spring 200 is contracted.

Also, a first bent portion 540 formed on the first member 100 may serve as a stopper.

Specifically, when the coil spring 200 is maximally contracted, one end of the second plate-shaped member 410 formed on the second member 300 comes into contact with the second bent portion 540 formed on the first member 100. In this case, the first bent portion 540 may prevent the second plate-shaped member 410 from moving in the direction in which the coil spring 200 is contracted.

On the other hand, the first pressing portion 530 in accordance with the present invention may extend laterally from the first terminal 120.

Also, the protruding portion 400 in accordance with the present invention includes: a parallel portion 401 in parallel with the second plate-shaped member 410 with the first plate-shaped member 510 therebetween; a connection portion 402 connecting the second plate-shaped member 410 and the parallel portion 401; and a bent portion 403 bent from the parallel portion 401 in a direction away from the first plate-shaped member 510.

The protruding portion 400 having the above-described structure in accordance with the present invention may have a U-shaped structure extending to one side of the second plate-shaped member 410.

Each of the connection portion 402 and the bent portion 403 may protrude outward further than the coil spring 200 so that the protruding portion 400 presses the coil spring 200.

The coil spring 200 is hooked by the coil spring 200 by the above-described structure of the protruding portion 400 and is not spread any more, and a length of the coil spring when the coil spring 200 is maximally spread is a maximum distance between the protruding part 400 formed on the second member 300 and the first pressing part 530 formed on the first member 100.

In the structure of the contact pin in accordance with the present invention, the maximum distance is a distance from the protruding portion 400 to the first pressing portion 530 when the protruding portion 400 comes into contact with the hook portion 500.

The first terminal 120 in accordance with the present invention may be integrated with the first plate-shaped member 510 and made of a metal plate, and the second terminal 320 may be integrated with the second plate-shaped member 410 and made of a metal plate.

A first bent portion 540 may be disposed between the first terminal 120 and the first plate-shaped member 510, and a second bent portion 440 may be disposed between the second terminal 320 and the second plate-shaped member 410.

Also, the first terminal 120 may have a plate shape extending from the first bent portion 540, and the second terminal 320 may have a plate shape extending from the second bent portion 440.

The contact pin having the above-described configuration in accordance with the present invention may be provided in plurality in a test socket coupled to a test board to form one test socket.

That is, the test socket in accordance with the present invention may include: a socket body to which a semiconductor product to be tested is mounted; and a plurality of contact pins installed on the socket body to electrically connect a terminal of the semiconductor product to a terminal on the test board, and at least one of the contact pins may be the contact pin described above.

Figure 14A:
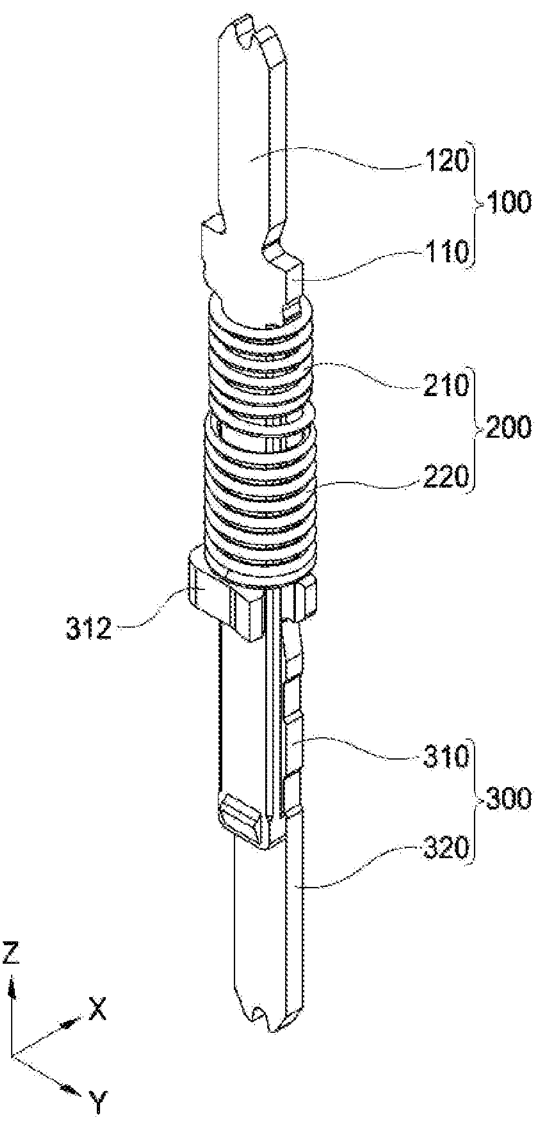
FIG. 14A is a perspective view illustrating a contact pin in accordance with a modified example of the present invention.
Figure 14B:
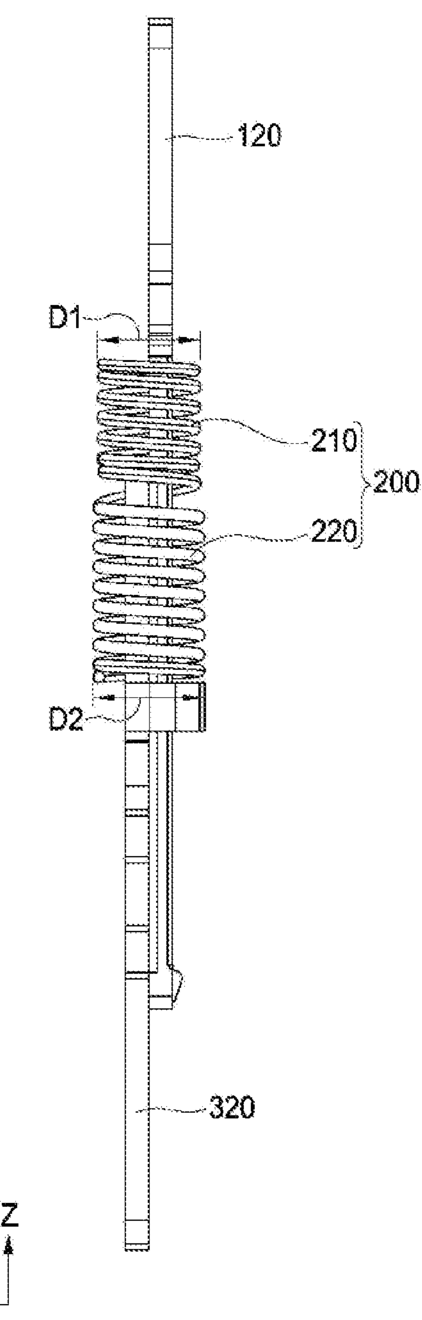
FIGS. 14B and 14C are cross-sectional views illustrating a contact pin in accordance with a modified example of the present invention.
Figure 14C:
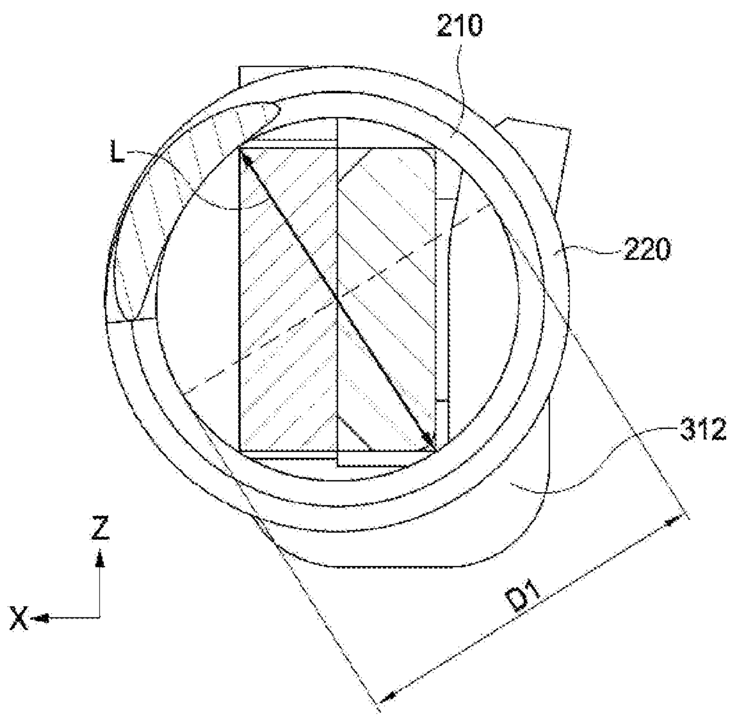

As illustrated in FIGS. 14A to 14C, a contact pin in accordance with the present invention may include: a first member 100 having a first terminal 120 disposed at one end thereof and contacting one of a test terminal and a terminal of a semiconductor product; a second member 300 having a second terminal disposed at one end thereof and contacting the other of the test terminal and the terminal of the semiconductor product; and a coil spring 200 into which at least a portion of the movably overlapped portion of the first member 100 and the second member 300 is inserted, and the coil spring 200 may include: a first coil spring portion 210 installed adjacent to the first terminal 120; and a second coil spring portion 220 installed adjacent to the second terminal 320 and connected to the first coil spring portion 210. Here, the first coil spring portion 210 may have a spring diameter D1 different from a spring diameter D2 of the second coil spring portion 220.

The first coil spring portion 210 may have the spring diameter D1 less than the spring diameter D2 of the second coil spring portion 220.

Also, as illustrated in FIG. 14C, a length difference between the spring diameter D1 of the first coil spring portion 210 and a diagonal length L of a horizontal cross-section of the movable overlapped portion of the first member 100 and the second member 300 is 0.05 mm or less.

Here, when the movably overlapped portion of the first member 100 and the second member 300 is inserted into the coil spring 200, as the overlapped portion is pressed by the first coil spring portion 210, and the first member 100 and the second member 300 come into close contact with each other, a current-carrying efficiency of the contact pin increases.

Particularly, the spring diameter D1 of the first coil spring portion 210 may be substantially equal to the diagonal length L of the horizontal cross-section of the movable overlapped portion of the first member 100 and the second member 300. In this case, the first member 100 and the second member 300 further come into close contact with each other, and the current-carrying efficiency increases.

Also, when a vertical length of the first coil spring portion 210 is a first pitch P1 and a vertical length of the second coil spring portion 220 is a second pitch P2, each of the first pitch P1 and the second pitch P2 may have various lengths.

Figure 15:
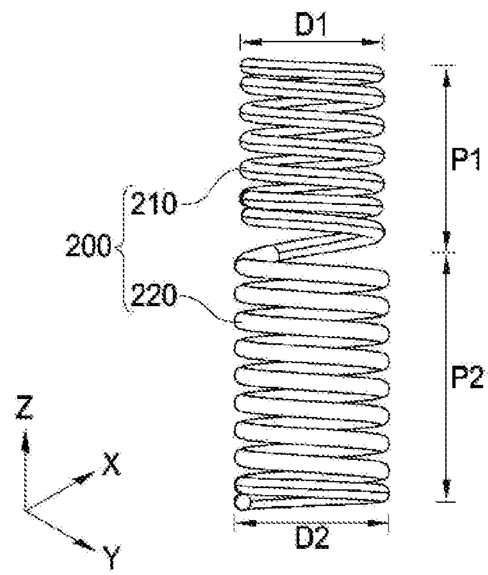
FIG. 15 is a perspective view illustrating a coil spring in accordance with a modified example of the present invention.

The first pitch P1 and the second pitch P2 may have different lengths, and the first pitch P1 may have a length less than that of the second pitch P2 as illustrated in FIG. 15.

The first member 100 may include a first plate-shaped member 110 in which a hook portion 111 is formed at the other end, and a first pressing portion 112 spaced apart from the hook portion 111 and pressing one end of the coil spring 200 is formed at one end, and the second member 300 may include a second plate-shaped member 310 in which the hook stepped portion 311 disposed parallel to the first plate-shaped member 110 is formed at one end so that the hook portion 111 is hooked in a direction in which the coil spring 200 is spread and the hook portion 111 moves in a direction in which the coil spring 200 is contracted, and a second pressing portion 312 pressing the other end of the coil spring 200 is formed at the other end.

The first terminal 120 may be integrated with the first plate-shaped member 110 and made of a metal plate, and the second terminal 320 may be integrated with the second plate-shaped member 310 and made of a metal plate.

Here, each of the first terminal 120 and the second terminal 320 may have various shapes. For example, each of the first terminal 120 and the second terminal 320 may have a linear plate shape, and at least one of the first terminal 120 and the second terminal 320 may be formed such that a metal plate is bent into a cylindrical shape.

Figure 16:
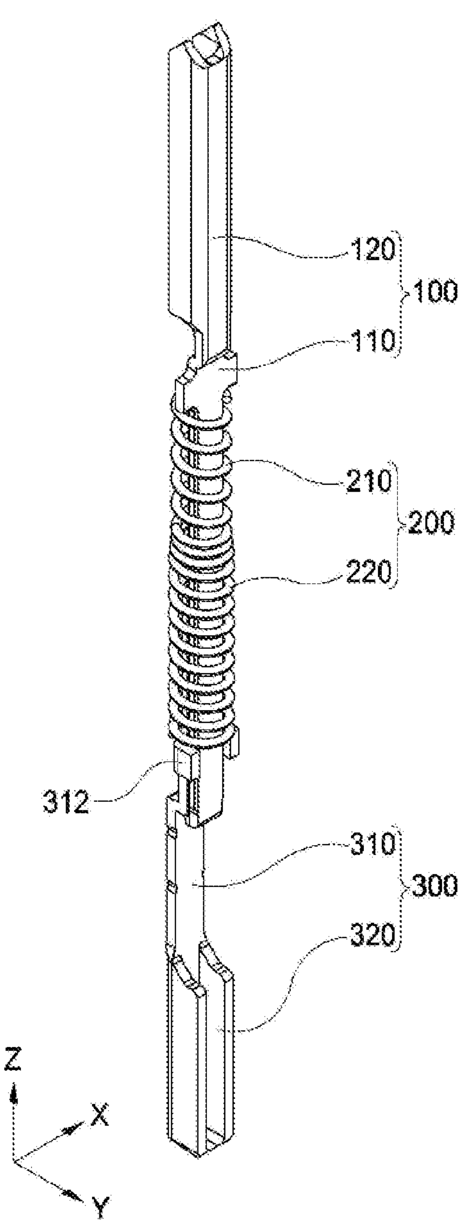
FIG. 16 is a perspective view illustrating a contact pin in accordance with a modified example of the present invention.

Also, as illustrated in FIG. 16, at least one of the first terminal 120 and the second terminal may be formed such that a metal plate is bent into a U-shape.

The contact pin and the test socket having the same in accordance with the present invention are configured so that the first member and the second member overlap in the vertical direction to linearly move to have the simple structure and remarkably improve the durability.

Particularly, the first member and the second member respectively have the first plate-shaped member and the second plate-shaped member, which overlap in the vertical direction, and since the first plate-shaped member and the second plate-shaped member are coupled while being inserted to the outer side of the spring, the assembly is simple, and the manufacturing is convenient.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. A contact pin comprising:

a first member having a first terminal disposed at one end thereof to contact one of a test terminal and a terminal of a semiconductor product;

a second member having a second terminal contacting another of the test terminal and the terminal of the semiconductor product; and a coil spring into which at least a portion of a movably overlapped portion of the first member and the second member is inserted, wherein the first member comprises a first plate-shaped member having a bent hook portion formed at another end thereof and a first pressing portion spaced apart from the hook portion to press one end of the coil spring, wherein the second member comprises a second plate-shaped member in which a hook stepped portion disposed in parallel with the first plate-shaped member is formed at one end so that the hook portion is hooked in a direction in which the coil spring is spread and moves in a direction in which the coil spring is contracted, and a second pressing portion configured to press another end of the coil spring is formed at another end of the second member, and wherein the second plate-shaped member comprises:

a first parallel portion parallel to the first plate-shaped member;

a bent portion integrally bent with the first parallel portion so as to be engaged with a portion in which the hook portion of the first plate-shaped member is formed; and a second parallel portion integrated with the bent portion so as to be parallel with the first parallel portion and connected to the second terminal.

2. The contact pin of claim 1, wherein the first pressing portion extends laterally from the first plate-shaped member, and the second pressing portion extends laterally from the second plate-shaped member.

3. The contact pin of claim 2, wherein the first pressing portion is bent perpendicularly to a plate surface of the first plate-shaped member to guide a linear movement of the second plate-shaped member.

4. The contact pin of claim 2, wherein the second pressing portion is bent perpendicularly to a plate surface of the second plate-shaped member to guide a linear movement of the first plate-shaped member.

5. The contact pin of claim 1, wherein the first terminal is integrated with the first plate-shaped member and made of a metal plate.

6. The contact pin of claim 5, wherein the first terminal is formed such that the metal plate is bent into a cylindrical shape.

7. The contact pin of claim 1, wherein the second terminal is integrated with the second plate-shaped member and made of a metal plate.

8. The contact pin of claim 7, wherein the second terminal is formed such that the metal plate is bent into a cylindrical shape.

9. The contact pin of claim 7, wherein a central axis of the first terminal and a central axis of the second terminal are coincide with or are eccentric with respect to each other.

10. A test socket comprising:

a socket body to which a semiconductor product to be tested is mounted; and a plurality of contact pins installed on the socket body to electrically connect a terminal of the semiconductor product and a terminal on a test board, wherein at least one of the contact pins is the contact pin of claim 1.

11. The test socket of claim 10, wherein a central axis of the first terminal and a central axis of the second terminal are coincided with or are eccentric with respect to each other.

12. A contact pin comprising:

a first member having a first terminal disposed at one end thereof to contact one of a test terminal and a terminal of a semiconductor product;

a second member having a second terminal contacting another of the test terminal and the terminal of the semiconductor product; and a coil spring into which at least a portion of a movably overlapped portion of the first member and the second member is inserted, wherein the first member comprises:

a first plate-shaped member having one end connected with the first terminal and another end on which a bent hook portion is formed; and a first pressing portion formed on the first terminal to press one end of the coil spring, wherein the second member comprises:

a second plate-shaped member having one end connected with the second terminal and overlapping the first plate-shaped member; and a protruding portion formed at one side of the second plate-shaped member to surround the first plate-shaped member, thereby pressing another end of the coil spring, wherein the protruding portion is hooked by the hook portion in a direction in which the coil spring is spread by a relative movement of the first plate-shaped member and the second plate-shaped member, and wherein the protruding portion comprises:

a parallel portion in parallel to the second plate-shaped member with the first plate-shaped member therebetween;

a connection portion configured to connect the second plate-shaped member and the parallel portion; and a bent portion bent from the parallel portion in a direction away from the first plate-shaped member.

13. The contact pin of claim 12, wherein the first pressing portion extends laterally from the first terminal.

14. The contact pin of claim 12, wherein the first terminal is integrated with the first plate-shaped member and made of a metal plate, and the second terminal is integrated with the second plate-shaped member and made of a metal plate.

15. The contact pin of claim 12, wherein a first bent portion is disposed between the first terminal and the first plate-shaped member, and a second bent portion is disposed between the second terminal and the second plate-shaped member.

16. The contact pin of claim 15, wherein the first terminal has a plate shape extending from the first bent portion, and the second terminal has a plate shape extending from the second bent portion.

17. A contact pin comprising:

a first member having a first terminal disposed at one end thereof to contact one of a test terminal and a terminal of a semiconductor product;

a second member having a second terminal contacting another of the test terminal and the terminal of the semiconductor product; and a coil spring into which at least a portion of a movably overlapped portion of the first member and the second member is inserted, wherein the coil spring comprises:

a first coil spring portion installed adjacent to the first terminal; and a second coil spring portion installed adjacent to the second terminal and connected with the first coil spring portion, wherein a spring diameter of the first coil spring portion is different from a spring diameter of the second coil spring portion, wherein the spring diameter of the first coil spring portion is less than the spring diameter of the second coil spring portion, and wherein a length difference between the spring diameter of the first coil spring portion and a diagonal length of a horizontal cross-section of the movably overlapped portion of the first member and the second member is 0.05 mm or less.

18. The contact pin of claim 17, wherein the first member comprises a first plate-shaped member having a bent hook portion formed at another end and a first pressing portion spaced apart from the hook portion to press one end of the coil spring, and the second member comprises a second plate-shaped member in which a hook stepped portion disposed in parallel with the first plate-shaped member is formed at one end so that the hook portion is hooked in a direction in which the coil spring is spread and moves in a direction in which the coil spring is contracted, and a second pressing portion configured to press another end of the coil spring is formed at another end of the second member.

19. The contact pin of claim 18, wherein the first terminal is integrated with the first plate-shaped member and made of a metal plate, and the second terminal is integrated with the second plate-shaped member and made of a metal plate.

20. The contact pin of claim 19, wherein at least one of the first terminal and the second terminal is formed such that the metal plate is bent into a cylindrical shape.

21. The contact pin of claim 19, wherein at least one of the first terminal and the second terminal is formed such that the metal plate is bent into a U-shape.

* * * * *